(12) United States Patent
Kellogg et al.

(10) Patent No.: US 9,171,702 B2
(45) Date of Patent: Oct. 27, 2015

(54) CONSUMABLE ISOLATION RING FOR MOVABLE SUBSTRATE SUPPORT ASSEMBLY OF A PLASMA PROCESSING CHAMBER

(75) Inventors: Michael C. Kellogg, Oakland, CA (US); Alexei Marakhtanov, Albany, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 986 days.

(21) Appl. No.: 12/828,098

(22) Filed: Jun. 30, 2010

(65) Prior Publication Data

US 2012/0000605 A1    Jan. 5, 2012

(51) Int. Cl.
| | |
|---|---|
| C23C 16/00 | (2006.01) |
| C23C 16/50 | (2006.01) |
| C23F 1/00 | (2006.01) |
| H01L 21/306 | (2006.01) |
| H01J 37/32 | (2006.01) |
| C23C 16/458 | (2006.01) |

(52) U.S. Cl.
CPC ....... *H01J 37/32642* (2013.01); *C23C 16/4585* (2013.01); *H01J 37/32091* (2013.01); *H01J 37/32495* (2013.01); *H01J 37/32623* (2013.01)

(58) Field of Classification Search
USPC ......... 118/715, 728–732; 156/345.51–345.55
See application file for complete search history.

(56) References Cited

U.S. PATENT DOCUMENTS

| | | | |
|---|---|---|---|
| 4,340,462 A | 7/1982 | Koch | |
| 4,948,458 A | 8/1990 | Ogle | |
| 5,200,232 A | 4/1993 | Tappan et al. | |
| 5,796,066 A | 8/1998 | Guyot | |
| 5,820,723 A | 10/1998 | Benjamin et al. | |
| 5,824,605 A | 10/1998 | Chen et al. | |
| 5,885,423 A | 3/1999 | Guyot | |
| 5,948,704 A | 9/1999 | Benjamin et al. | |
| 6,013,155 A | 1/2000 | McMillin et al. | |
| 6,090,304 A | 7/2000 | Zhu et al. | |
| 6,140,612 A | 10/2000 | Husain et al. | |
| 6,230,651 B1 | 5/2001 | Ni et al. | |
| 6,231,674 B1 * | 5/2001 | Chen et al. | 118/720 |
| 6,333,272 B1 | 12/2001 | McMillin et al. | |
| 6,589,352 B1 * | 7/2003 | Yudovsky et al. | 118/729 |
| 6,616,767 B2 * | 9/2003 | Zhao et al. | 219/121.52 |
| 6,824,627 B2 | 11/2004 | Dhindsa et al. | |
| 6,847,014 B1 | 1/2005 | Benjamin et al. | |
| 7,161,121 B1 | 1/2007 | Steger | |
| 2007/0169891 A1 * | 7/2007 | Koshiishi et al. | 156/345.47 |
| 2008/0149596 A1 | 6/2008 | Dhindsa et al. | |
| 2008/0182412 A1 * | 7/2008 | Bailey, III et al. | 438/689 |

OTHER PUBLICATIONS

Commonly-owned U.S. Appl. No. 61/238,656, filed Aug. 31, 2009.
Commonly-owned U.S. Appl. No. 61/238,665, filed Aug. 31, 2009.
Commonly-owned U.S. Appl. No. 61/238,670, filed Aug. 31, 2009.

* cited by examiner

*Primary Examiner* — Maureen Passey
*Assistant Examiner* — Tiffany Nuckols
(74) *Attorney, Agent, or Firm* — Buchanan, Ingersoll & Rooney PC

(57) ABSTRACT

A consumable isolation ring of a movable substrate support assembly is described. The consumable isolation ring is configured to be supported on a step of a movable ground ring fit around a fixed ground ring. The consumable isolation ring is configured to electrically isolate the movable ground ring from a dielectric ring of the movable substrate support assembly.

5 Claims, 8 Drawing Sheets

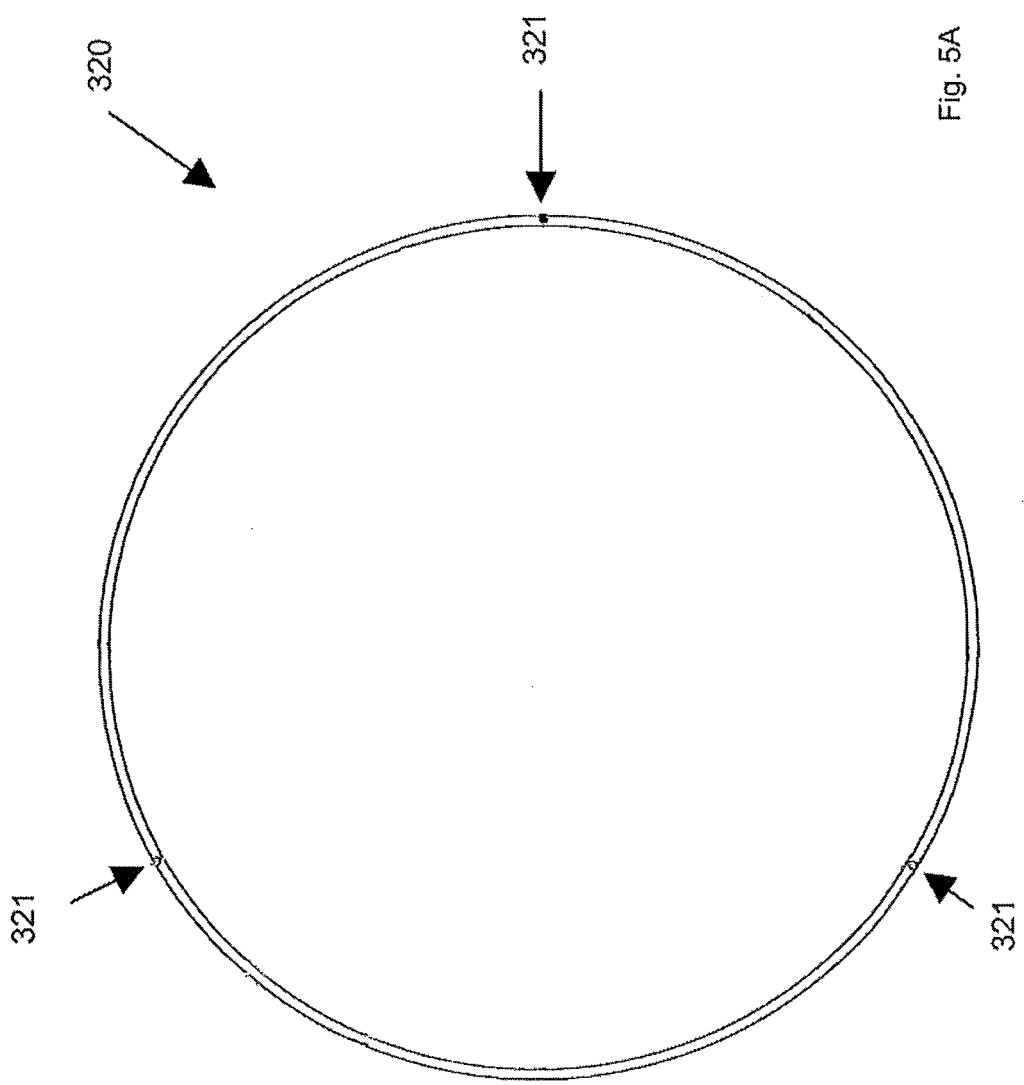

CONSUMABLE ISOLATION RING FOR MOVABLE SUBSTRATE SUPPORT ASSEMBLY OF A PLASMA PROCESSING CHAMBER

BACKGROUND

With each successive semiconductor technology generation, wafer diameters tend to increase and transistor sizes decrease, resulting in the need for an ever higher degree of accuracy and repeatability in substrate processing. Semiconductor substrate materials, such as silicon wafers, are routinely processed using plasma processing chambers. Plasma processing techniques include sputter deposition, plasma-enhanced chemical vapor deposition (PECVD), resist strip, and plasma etch. Plasma can be generated by subjecting suitable process gases in a plasma processing chamber to radio frequency (RF) power. Flow of RF current in the plasma processing chamber can affect the processing.

A plasma processing chamber can rely on a variety of mechanisms to generate plasma, such as inductive coupling (transformer coupling), helicon, electron cyclotron resonance, capacitive coupling (parallel plate). For instance, high density plasma can be produced in a transformer coupled plasma (TCP™) processing chamber, or in an electron cyclotron resonance (ECR) processing chamber. Transformer coupled plasma processing chambers, wherein RF energy is inductively coupled into the chambers, are available from Lam Research Corporation, Fremont, Calif. An example of a high-flow plasma processing chamber that can provide high density plasma is disclosed in commonly-owned U.S. Pat. No. 5,948,704, the disclosure of which is hereby incorporated by reference. Parallel plate plasma processing chambers, electron-cyclotron resonance (ECR) plasma processing chambers, and transformer coupled plasma (TCP™) processing chambers are disclosed in commonly-owned U.S. Pat. Nos. 4,340,462; 4,948,458; 5,200,232 and 5,820,723, the disclosures of which are hereby incorporated by reference.

By way of example, plasma can be produced in a parallel plate processing chamber such as the dual frequency plasma etching chamber described in commonly-owned U.S. Pat. No. 6,090,304, the disclosure of which is hereby incorporated by reference. A preferred parallel plate plasma processing chamber is a dual frequency capacitively coupled plasma processing chamber including an upper showerhead electrode and a substrate support. For purposes of illustration, embodiments herein are described with reference to a parallel plate type plasma processing chamber.

A parallel plate plasma processing chamber for plasma etching is illustrated in FIG. 1. The plasma processing chamber 100 comprises a chamber 110, an inlet load lock 112, and an optional outlet load lock 114, further details of which are described in commonly-owned U.S. Pat. No. 6,824,627, which is hereby incorporated by reference in its entirety.

The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber 110. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma processing chamber, such as a parallel plate plasma processing chamber, preferably the chamber pressure is maintained at a pressure below about 200 mTorr (e.g., less than 100 mTorr such as 20 to 50 mTorr) ("about" as used herein means ±10%).

The vacuum pump 172 can be connected to an outlet in a wall of the chamber 110 and can be throttled by a valve 173 in order to control the pressure in the chamber. Preferably, the vacuum pump is capable of maintaining a pressure within the chamber 110 of less than 200 mTorr while etching gases are flowed into the chamber 110.

The chamber 110 includes an upper electrode assembly 120 including an upper electrode 125 (e.g., showerhead electrode), and a substrate support 150. The upper electrode assembly 120 is mounted in an upper housing 130. The upper housing 130 can be moved vertically by a mechanism 132 to adjust the gap between the upper electrode 125 and the substrate support 150.

A process gas source 170 can be connected to the housing 130 to deliver process gas comprising one or more gases to the upper electrode assembly 120. In a preferred plasma processing chamber, the upper electrode assembly comprises a gas distribution system, which can be used to deliver process gas to a region proximate to the surface of a substrate. Gas distribution systems, which can comprise one or more gas rings, injectors and/or showerheads (e.g., showerhead electrodes), are disclosed in commonly-owned U.S. Pat. Nos. 6,333,272; 6,230,651; 6,013,155 and 5,824,605, the disclosures of which are hereby incorporated by reference.

The upper electrode 125 preferably comprises a showerhead electrode, which includes gas holes (not shown) to distribute process gas therethrough. The gas holes can have a diameter of 0.02 to 0.2 inch. The showerhead electrode can comprise one or more vertically spaced-apart baffle plates that can promote the desired distribution of process gas. The upper electrode and the substrate support may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the substrate support 150.

The substrate support 150 can have one or more embedded clamping electrodes for electrostatically clamping a substrate on an upper surface 155 (support surface) of the substrate support 150. The substrate support 150 can be powered by an RF source and attendant circuitry (not shown) such as RF matching circuitry. The substrate support 150 is preferably temperature controlled and may optionally include a heating arrangement (not shown). Examples of heating arrangements are disclosed in commonly assigned U.S. Pat. Nos. 6,847,014 and 7,161,121, which are hereby incorporated by reference. The substrate support 150 can support a semiconductor substrate such as a flat panel or 200 mm or 300 mm wafer on the support surface 155.

The substrate support 150 preferably includes passages therein for supplying a heat transfer gas such as helium under the substrate supported on the support surface 155 to control the substrate temperature during plasma processing thereof. For example, helium back cooling can maintain wafer temperature low enough to prevent burning of photoresist on the substrate. A method of controlling a temperature of a substrate by introducing a pressurized gas into a space between the substrate and the substrate support surface is disclosed in commonly-owned U.S. Pat. No. 6,140,612, the disclosure of which is hereby incorporated by reference.

The substrate support 150 can include lift pin holes (not shown), through which lift pins can be actuated vertically by suitable mechanisms and raise the substrate off the support surface 155 for transport into and out from the chamber 110.

The lift pin holes can have a diameter of about 0.08 inch. Details of lift pin holes are disclosed in commonly owned U.S. Pat. Nos. 5,885,423 and 5,796,066, the disclosures of which is hereby incorporated by reference.

FIG. 2 shows a block diagram of a capacitively coupled plasma processing chamber 200 to illustrate flow path of RF current therein. A substrate 206 is being processed within processing chamber 200. To ignite the plasma for etching substrate 206, a process gas in the chamber 200 is subjected to RF power. RF current may flow from an RF supply 222 along a cable 224 through an RF match network 220 into processing chamber 200 during substrate processing. The RF current may travel along a path 240 to couple with the process gas to create plasma within a confined chamber volume 210 for processing substrate 206, which is positioned above a bottom electrode 204.

In order to control plasma formation and to protect the processing chamber walls, a confinement ring 212 may be employed. Details of an exemplary confinement ring are described in commonly owned U.S. Provisional Patent Application Ser. Nos. 61/238,656, 61/238,665, 61/238,670, all filed on Aug. 31, 2009, and U.S. Patent Application Publication No. 2008/0149596, the disclosures of which are hereby incorporated by reference. The confinement ring 212 may be made of a conductive material such as silicon, polysilicon, silicon carbide, boron carbide, ceramic, aluminum, and the like. Usually, the confinement ring 212 may be configured to surround the periphery of confined chamber volume 210 in which a plasma is to form. In addition to the confinement ring 212, the periphery of confined chamber volume 210 may also be defined by upper electrode 202, bottom electrode 204, one or more insulator rings such as 216 and 218, an edge ring 214 and a lower electrode support structure 228.

In order to exhaust neutral gas species from the confinement region (confined chamber volume 210), the confinement rings 212 may include a plurality of slots (such as slots 226a, 226b, and 226c). The neutral gas species may traverse from confined chamber volume 210 into an external region 232 (outside chamber volume) of processing chamber 200 before being pumped out of processing chamber 200 via a turbo pump 234.

The plasma formed during substrate processing should be kept within confined chamber volume 210. However, under certain conditions, plasma may be ignited outside of confined chamber volume 210. In an example, given a high pressurized environment, the neutral gas species (which are being exhausted from confined chamber volume 210 into external region 232 of processing chamber 200) may encounter an RF field. The existence of RF fields in the outside chamber may cause the formation of unconfined plasma 250.

In a typical processing environment, the RF current flows from an RF generator into confined chamber volume 210 and then to an electrical ground. A flow path of the RF current from the chamber volume 210 to the electrical ground is called an RF return path. With reference to FIG. 2, an RF return path 242 may include the RF return current flowing along the inside of set of confinement rings 212. At point 252, the RF return current may flow along the outside of confinement rings 212 to bridge with the inside wall surface of processing chamber 200. From the chamber wall, the RF return current may follow a set of straps 230 to lower electrode support structure 228. From the surface of lower electrode support structure 228, the RF return current may flow back to RF source 222 via RF match 220.

As can be seen from the foregoing, by following path 242, the RF current flows outside of confined chamber volume 210 on its way to the electrical ground. As a result, an RF field may be generated in the outside chamber region. The existence of such RF field may cause unconfined plasma 250 to be formed in external region 232 of processing chamber 200.

Accordingly, an arrangement for providing a short RF return path while preventing the ignition of unconfined plasma is desirable.

SUMMARY

Described herein is a consumable isolation ring of an adjustable gap capacitively-coupled plasma processing chamber, the consumable isolation ring having a rectangular cross section with an inner diameter of about 14.8 inches, an outer diameter of about 15.1 inches, and a height of about 0.3 inch, and three recesses azimuthally spaced by 120° and disposed in a lower outer edge of the consumable isolation ring, wherein: each recess has a semi-cylindrical walled portion with a diameter of about 0.1 inch, a center axis of the semi-cylindrical walled portion located at a radius of about 7.5 inches from a center axis of the consumable isolation ring; each recess has a straight walled portion open on an outer surface of the consumable isolation ring, the straight walled portion having a width equal to the diameter of the semi-cylindrical walled portion and connected with the semi-cylindrical walled portion; and each recess has a depth of about 0.09 inch.

BRIEF DESCRIPTION OF FIGURES

FIGS. 5A-5C show details of a consumable isolation ring with a plurality of recesses.

DETAILED DESCRIPTION

Figure 1:
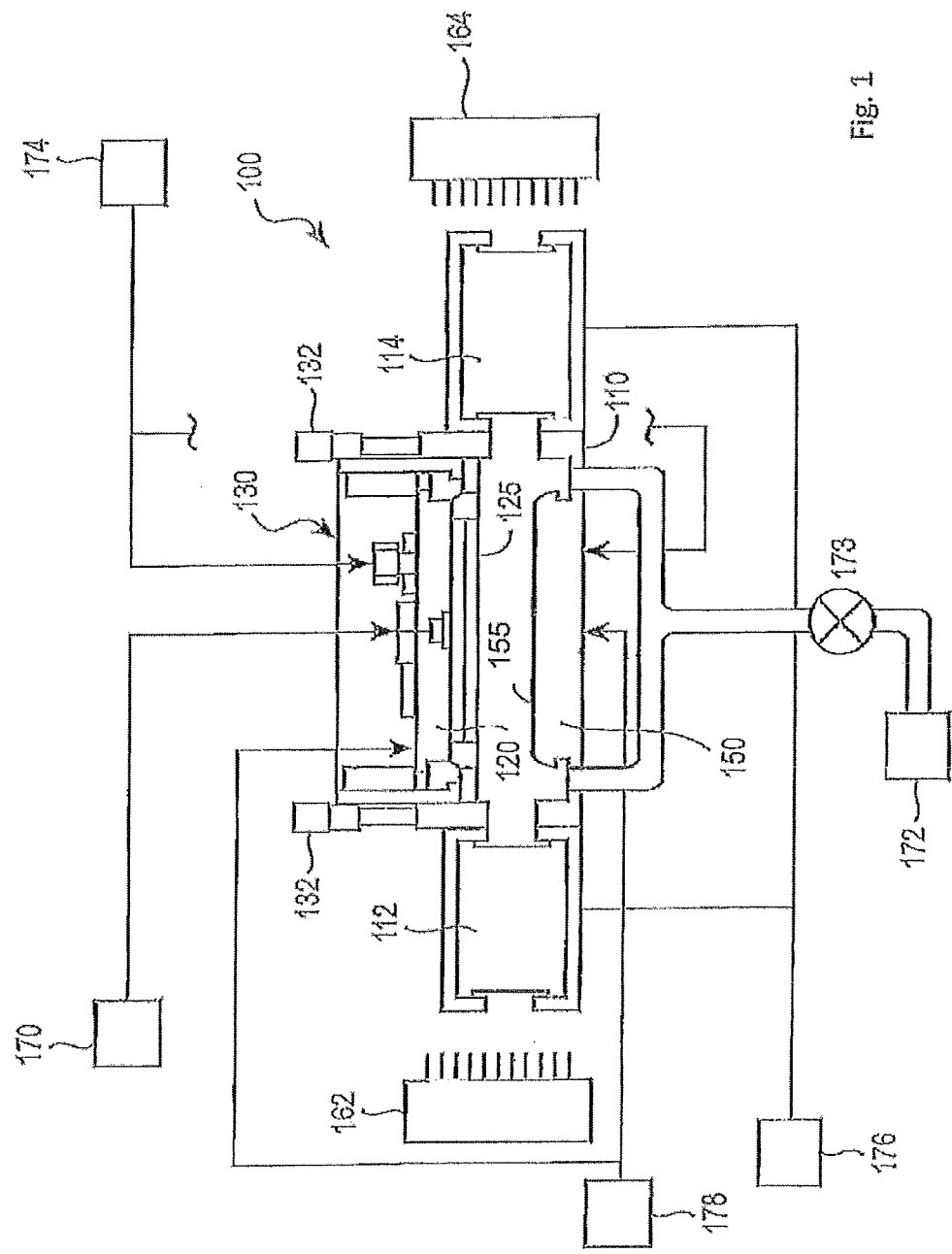
FIG. 1 shows a schematic of an exemplary plasma processing chamber.
Figure 2:
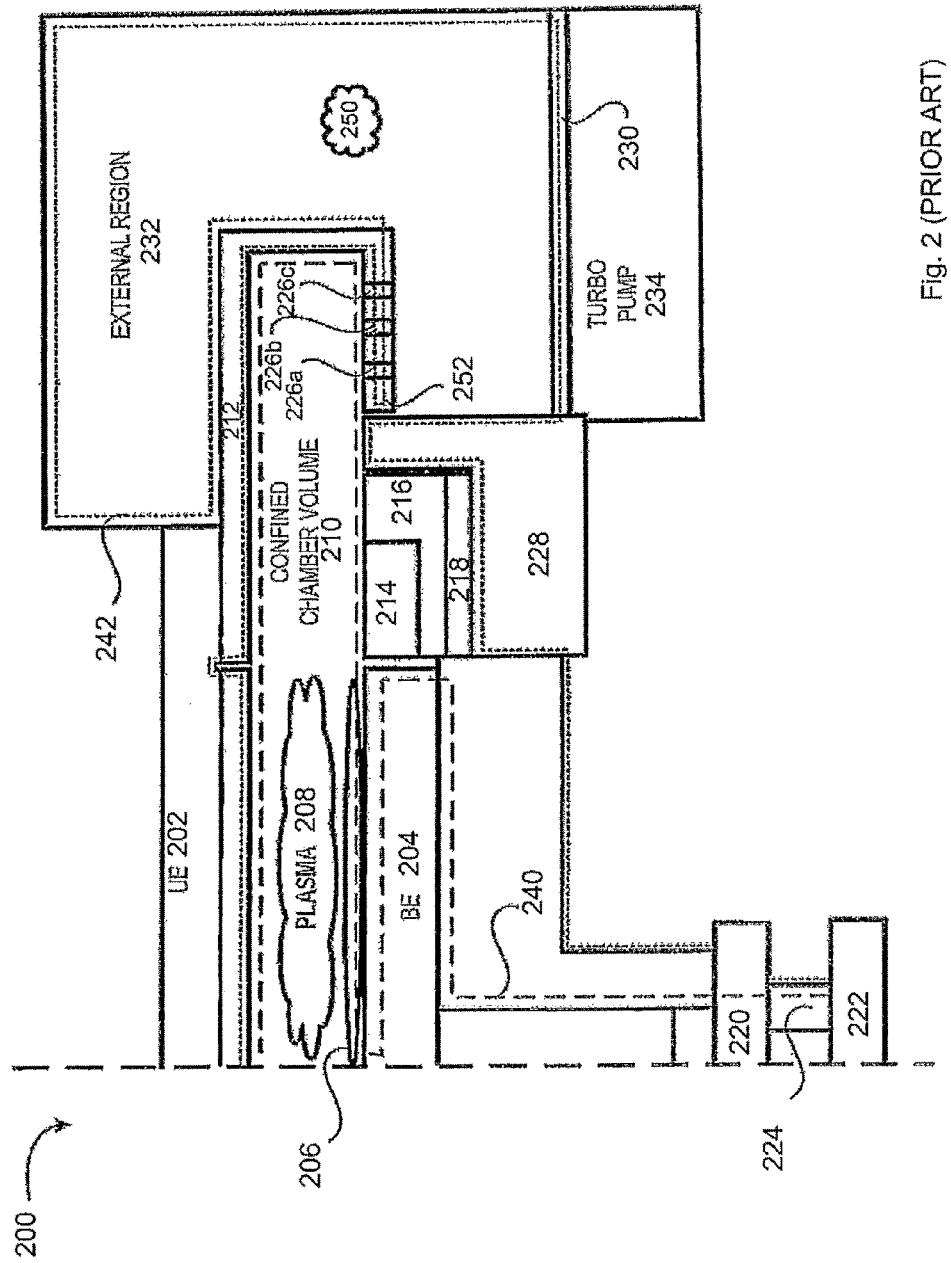
FIG. 2 shows a block diagram of a capacitively-coupled plasma processing chamber and an RF return path therein.
Figure 3A:
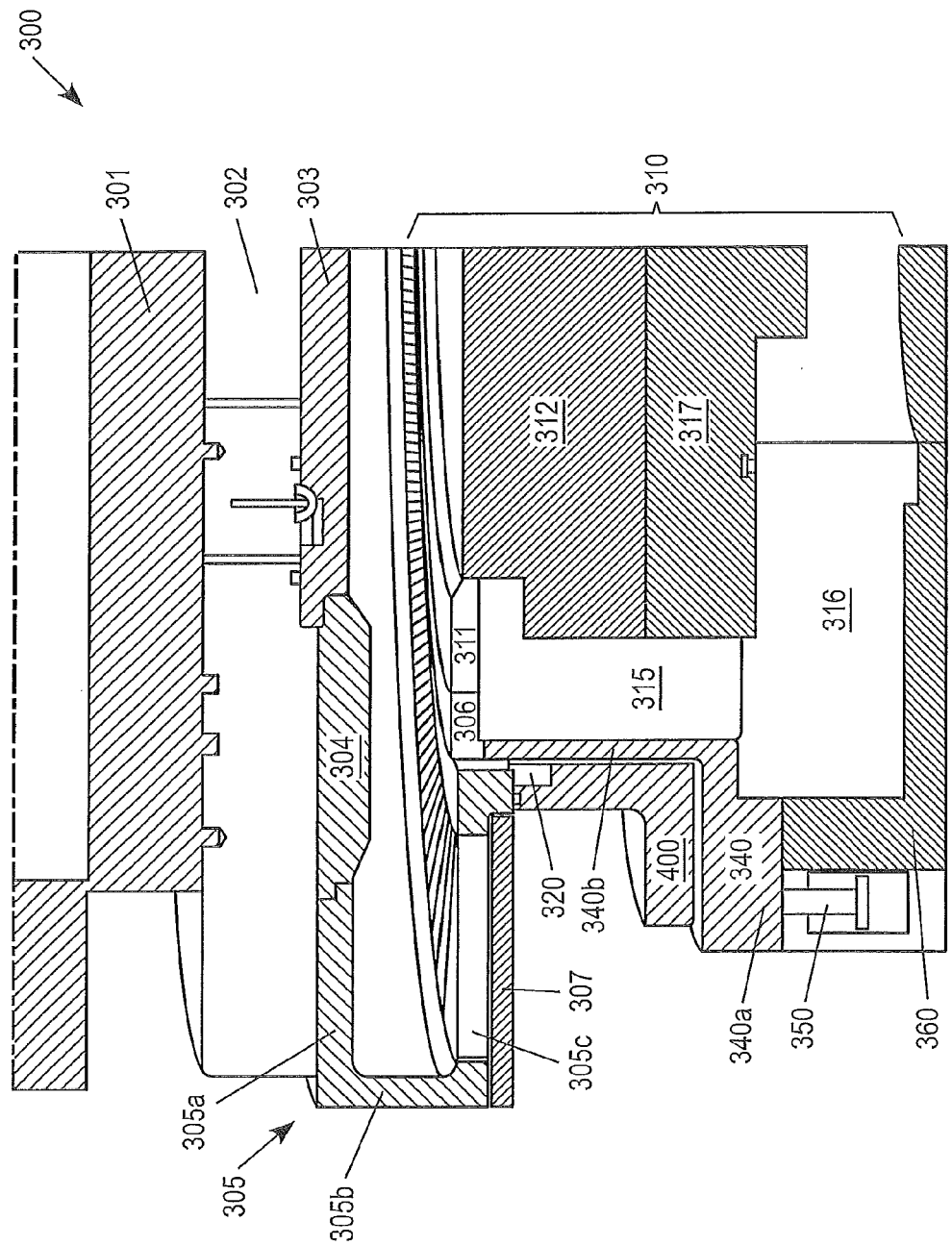
FIG. 3A shows a partial cross section of an exemplary adjustable gap capacitively-coupled plasma processing chamber when a movable substrate support assembly thereof is in an upper position.
Figure 3B:
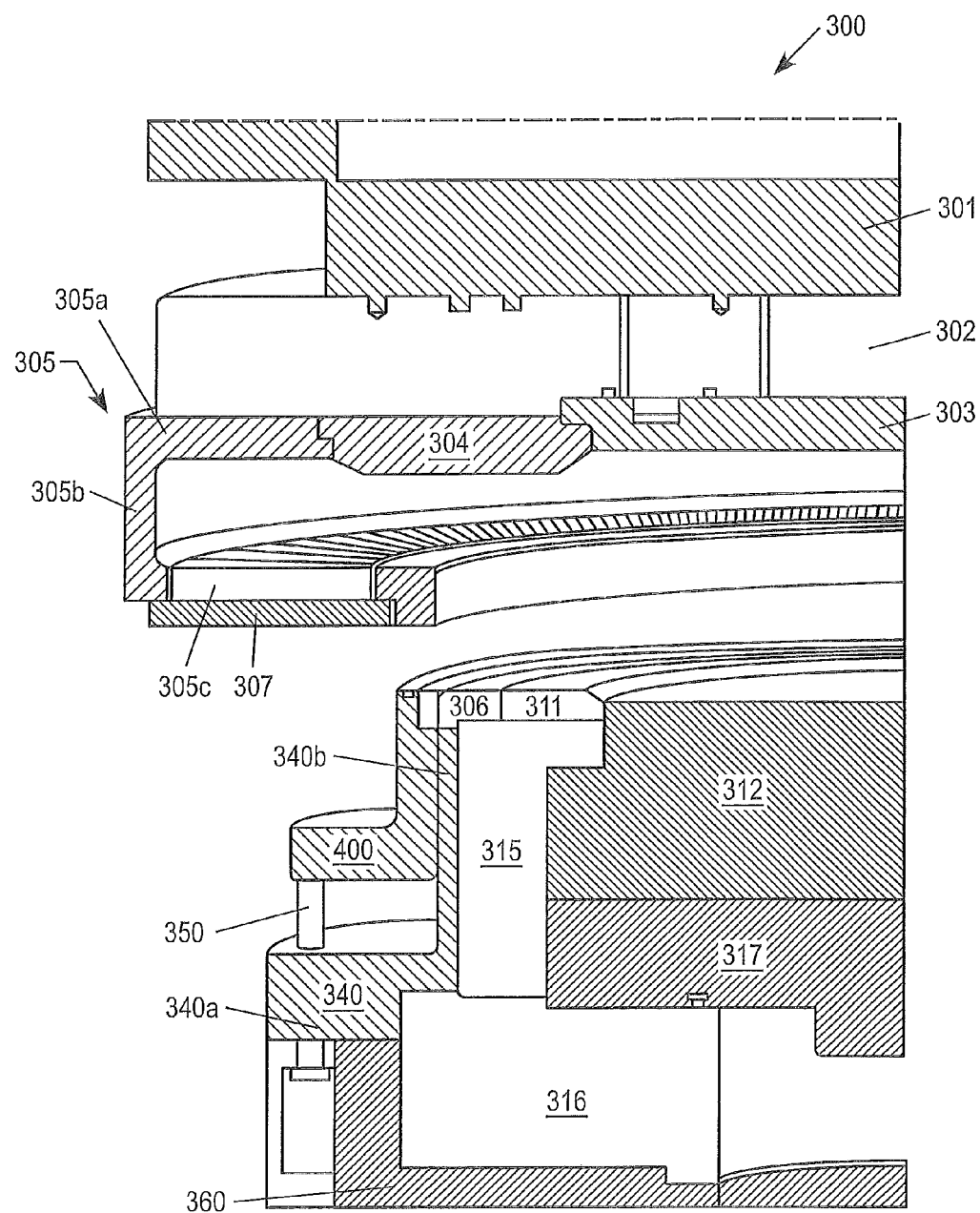
FIG. 3B shows a partial cross section of the exemplary adjustable gap capacitively-coupled plasma processing chamber of FIG. 3A wherein a movable substrate support assembly thereof is in a lower position.

Described herein is a consumable isolation ring surrounding a movable substrate support assembly in an adjustable gap capacitively-coupled plasma processing chamber. FIGS. 3A and 3B show a partial cross section of an exemplary adjustable gap capacitively-coupled plasma processing chamber 300. The chamber 300 comprises a movable substrate support assembly 310, an upper electrode including a center electrode plate 303 and an annular outer electrode 304 and an electrically conductive confinement ring 305 extending outwardly from the annular outer electrode 304, the confinement ring 305 including an upper horizontal section 305a, a vertical section 305b extending downwardly from an outer end of the upper horizontal section 305a and a lower horizontal section 305c extending inwardly from a lower end of the vertical section 305b, the lower horizontal section 305c including radially extending slots through which process gas and reaction byproducts are pumped out of the plasma processing chamber 300. A lower surface of an inner end of the lower horizontal section 305c provides electrical contact with an upper end of a movable ground ring 400 when the movable substrate support assembly 310 is in an upper position as shown in FIG. 3A. The lower surface of an inner end of the lower horizontal section 305c preferably includes an electrically conductive coating adapted to enhance electrical contact with the movable ground ring 400. Plasma processing of a semiconductor substrate supported on the movable substrate support assembly 310 is carried out when the movable substrate support assembly 310 is at the upper position. The confinement ring 305 can include at least one slotted ring 307 below the lower horizontal section 305c, the slotted ring 307 being rotatable with respect to the lower horizontal section 305c to adjust gas flow conductance through the radially extending slots. FIG. 3B shows a lower position of the movable substrate support assembly 310 at which a semiconductor substrate can be transferred onto the movable substrate support assembly 310.

The movable substrate support assembly 310 comprises the movable ground ring 400, a lower electrode 317, an electrostatic chuck (ESC) 312 on which a semiconductor substrate is electrostatically clamped, an edge ring 311 having a plasma exposed surface surrounding the ESC 312, a dielectric ring 306 having a plasma exposed surface surrounding the edge ring 311, at least one insulator ring 315 beneath the edge ring 311, a fixed ground ring 340 of electrically conductive material beneath the dielectric ring 306 and surrounding the insulator ring 315. The movable ground ring 400 is supported on depressible plungers 350 supported on the fixed ground ring 340. The movable ground ring 400 is movable vertically with respect to the fixed ground ring 340 so as to make electrical contact with the confinement ring 305 when the movable substrate support assembly 310 is moved to the upper position. The movable substrate support assembly 310 can be supported on an electrically grounded bias housing 360.

The fixed ground ring 340 can include three plunger support bores circumferentially spaced apart in an outer portion of the bottom wall, each of the plunger support bores engaging a plunger support housing containing depressible pins such that upper ends of the pins extend above an upper surface of the bottom wall.

Figure 4A:
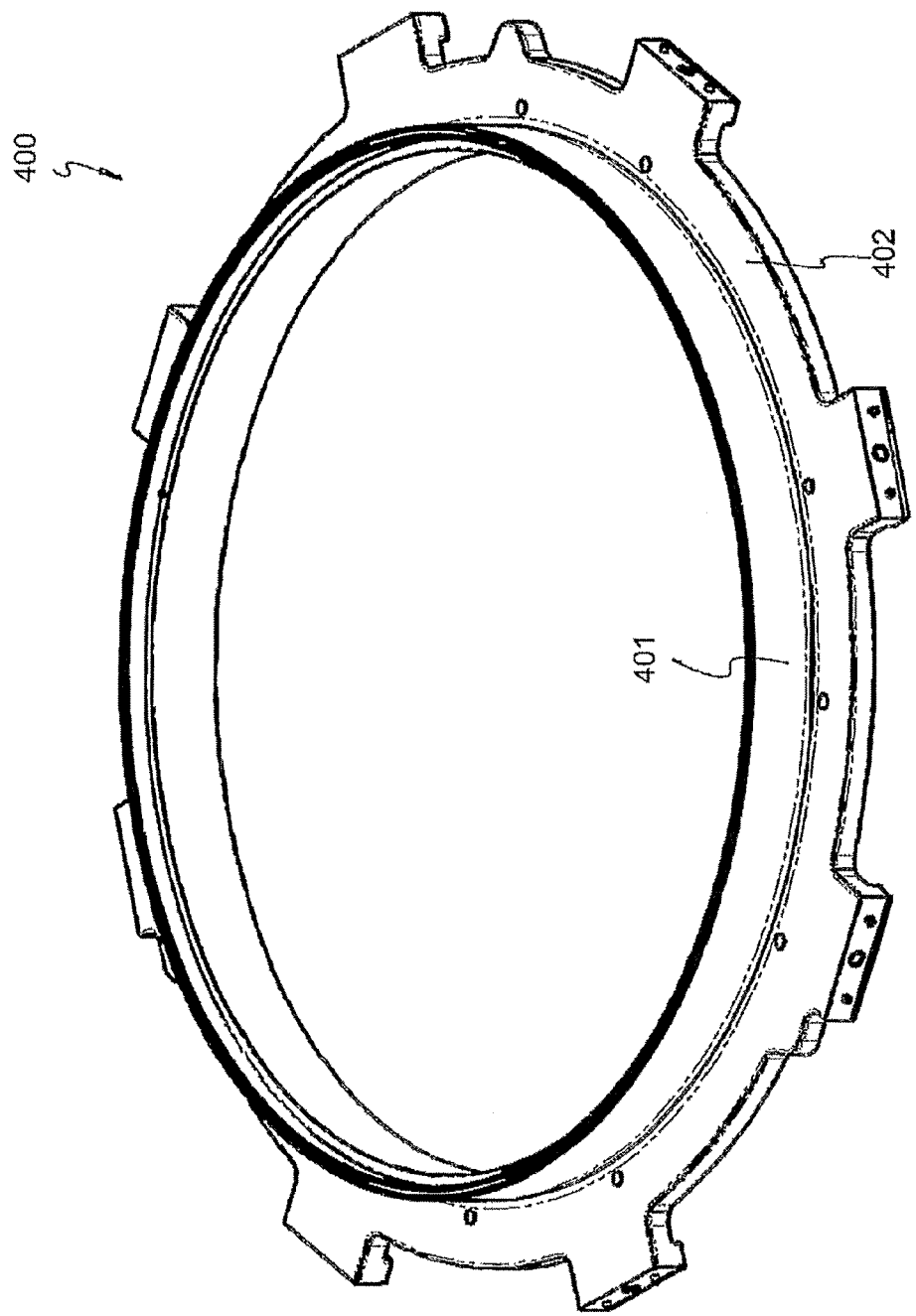
FIGS. 4A-4C show details of a movable ground ring of the movable substrate support assembly.
Figure 4C:
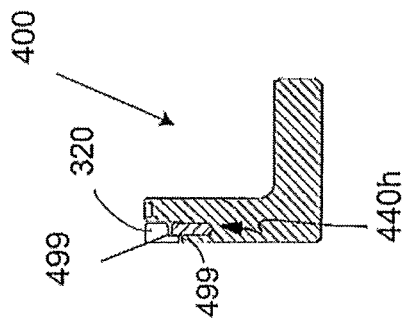
Figure 4B:
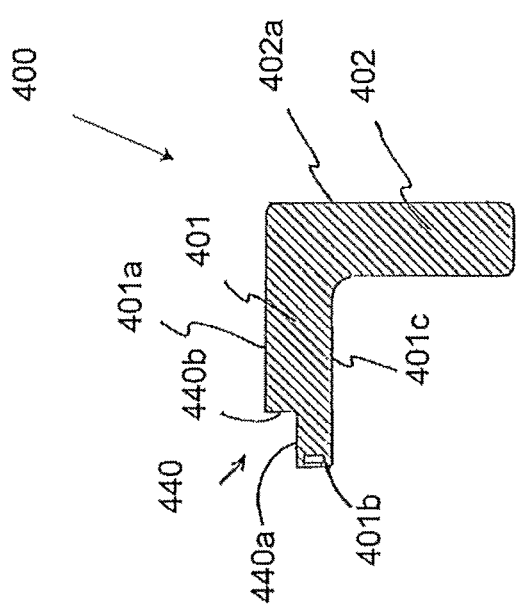

FIGS. 4A-4C show details of the movable ground ring 400. The movable ground ring 400 comprises an annular bottom wall 402 and a sidewall 401 extending upwardly from an inner periphery of the bottom wall 402. The side wall 401 has an inner surface 401a configured to surround an outer periphery of the fixed ground ring 340 such that the movable ground ring 400 is movable vertically with respect to the fixed ground ring 340.

As shown in FIG. 4B, the movable ground ring 400 preferably has in the inner surface 401a a step 440 formed by a vertical surface 440a extending from the upper surface 401b of the sidewall 401 and a horizontal surface 440b extending between the inner surface 401a and the vertical surface 440a. As shown in FIG. 4C, the horizontal surface 440b includes a plurality of blind holes 440h adapted to receive vertical pins 499 which mate with alignment holes in a lower surface of a consumable isolation ring 320 (FIGS. 3A-3B) adapted to electrically isolate the upper end of the sidewall 401 from the dielectric ring 306 when the movable substrate support assembly 310 is at the lower position.

As shown in FIG. 5A, the consumable isolation ring 320 includes a plurality of centering recesses 321 in a lower surface thereof. The recesses 321 are configured to receive the vertical pins 499 extending from blind holes 440h in the horizontal surface 440b of the step 440, each of the vertical pins 499 located in a respective one of the centering recesses 321.

Figure 5C:
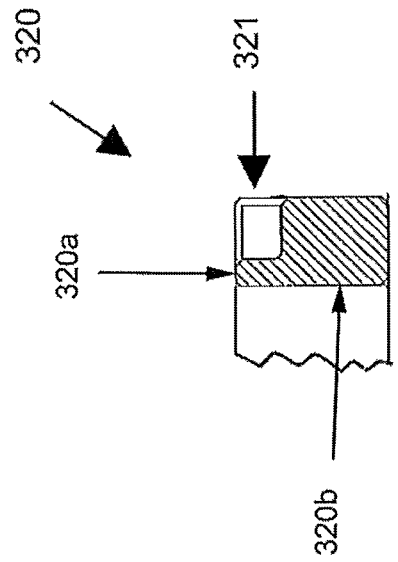
Figure 5B:
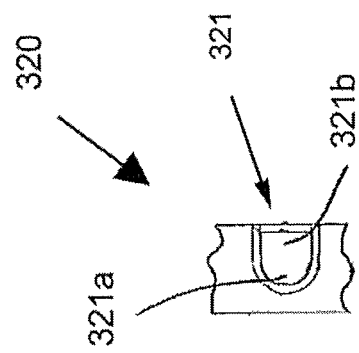

In one embodiment, as shown in FIGS. 5A-5C, the consumable isolation ring 320 has a rectangular cross section with an inner diameter of about 14.8 inches, an outer diameter of about 15.1 inches, and a height of about 0.3 inch. Three recesses 321 azimuthally spaced by 120° are disposed in a lower outer corner of the consumable isolation ring 320. Each recess 321 has a semi-cylindrical walled portion 321a with a diameter of about 0.1 inch. A center axis of the semi-cylindrical walled portion 321a is located at a radius of about 7.5 inches from a center axis of the consumable isolation ring 320. The semi-cylindrical walled portion 321a is connected with a straight walled portion 321b open on an outer surface of the consumable isolation ring 320. The straight walled portion 321b has a width equal to the diameter of the semi-cylindrical walled portion 321a. The recess 321 has a depth of about 0.09 inch. All edges of the recess 321 preferably have a 45° chamfer of about 0.02 inch wide. The recesses 321 are configured to accommodate differences in thermal expansion coefficients of the consumable isolation ring 320 and the movable ground ring 400, which is preferably made of aluminum, and centrally align the consumable isolation ring 320 to the movable ground ring 400 in a temperature range they are exposed to. As shown in FIGS. 3A, 3B, 4B, 4C and 5C, when the consumable isolation ring 320 is supported on the step 440 of the movable ground ring 400, an inner surface 320b of the consumable isolation ring 320 is substantially coextensive with the inner surface 401a of the sidewall 401 of the movable ground ring 400 and an upper surface 320a of the consumable isolation ring 320 is substantially coextensive with the upper surface 401b of the sidewall 401 of the movable ground ring 400.

The consumable isolation ring 320 can be made from one or more suitable materials such as quartz, silicon, silicon carbide, yttria, alumina, or a spray coated metal. Preferably, the consumable isolation ring 320 is made of quartz.

While the consumable isolation ring has been described in detail with reference to specific embodiments thereof, it will be apparent to those skilled in the art that various changes and modifications can be made, and equivalents employed, without departing from the scope of the appended claims.

We claim:

1. A consumable isolation ring of an adjustable gap capacitively-coupled plasma processing chamber,
   the consumable isolation ring having a rectangular cross section with an inner diameter of about 14.8 inches, an outer diameter of about 15.1 inches, and a height of about 0.3 inch, and three recesses azimuthally spaced by 120° and disposed in a lower outer edge of the consumable isolation ring, each recess consisting of a single semi-cylindrical walled portion connected with a respective straight walled portion, wherein:
   the semi-cylindrical walled portions of each recess have a diameter of about 0.1 inch, a center axis of the respective semi-cylindrical walled portions located at a radius of about 7.5 inches from a center axis of the consumable isolation ring;
   the straight walled portions of each recess open on an outer surface of the consumable isolation ring, the straight walled portions having a width equal to the diameter of the respective semi-cylindrical walled portions connected to respective straight walled portions;
   each recess has a depth of about 0.09 inch; and
   the consumable isolation ring configured to be supported on a step of a movable ground ring and wherein an inner surface of the consumable isolation ring is vertically above and substantially coextensive with an inner surface of a sidewall of the movable ground ring and an upper surface of the consumable isolation ring is substantially coextensive with an upper surface of the sidewall of the movable ground ring, when the consumable isolation ring is supported on the step of the movable ground ring.

2. The consumable isolation ring of claim 1, wherein all edges of the recesses have a 45° chamfer of about 0.02 inch wide.

3. The consumable isolation ring of claim 1, wherein:
the movable ground ring is configured to fit around and provide an RF return path to a fixed ground ring of a movable substrate support assembly configured to support a semiconductor substrate undergoing plasma processing,
the movable ground ring comprises an annular bottom wall, a sidewall extending upwardly from an inner periphery of the bottom wall, the sidewall having an inner surface configured to surround an outer periphery of the fixed ground ring such that the movable ground ring is movable vertically with respect to the fixed ground ring,
the step is formed by a vertical surface extending from an upper surface of the sidewall and a horizontal surface extending between the inner surface and the vertical surface, the horizontal surface including a plurality of blind holes adapted to receive pins which mate with the recesses of the consumable isolation ring.

4. The consumable isolation ring of claim 1, configured to electrically isolate the movable ground ring from a dielectric ring of the movable substrate support assembly wherein the dielectric ring has a plasma exposed surface surrounding an edge ring.

5. The consumable isolation ring of claim 1, made of one or more materials selected from a group consisting quartz, silicon, silicon carbide, yttria, alumina, and a spray coated metal.

* * * * *